US011733271B2

(12) United States Patent
Bartlett

(10) Patent No.: US 11,733,271 B2
(45) Date of Patent: Aug. 22, 2023

(54) MULTI-SEGMENTED ROGOWSKI-COIL CURRENT SENSOR

(71) Applicant: Tektronix, Inc., Beaverton, OR (US)

(72) Inventor: Josiah A. Bartlett, Forest Grove, OR (US)

(73) Assignee: Tektronix, Inc., Beaverton, OR (US)

(*) Notice: Subject to any disclaimer, the term of this patent is extended or adjusted under 35 U.S.C. 154(b) by 29 days.

(21) Appl. No.: 17/478,738

(22) Filed: Sep. 17, 2021

(65) Prior Publication Data

US 2022/0099706 A1    Mar. 31, 2022

Related U.S. Application Data

(60) Provisional application No. 63/083,526, filed on Sep. 25, 2020.

(51) Int. Cl.
*G01R 15/18* (2006.01)
*G01R 19/10* (2006.01)

(52) U.S. Cl.
CPC ........... *G01R 15/181* (2013.01); *G01R 19/10* (2013.01)

(58) Field of Classification Search
CPC .............................. G01R 15/181; G01R 19/10
USPC ........................................................ 324/127
See application file for complete search history.

(56) References Cited

U.S. PATENT DOCUMENTS

| | | | | |
|---|---|---|---|---|
| 7,274,186 B2* | 9/2007 | Yakymyshyn | ....... | G01R 15/207 324/117 R |
| 10,746,767 B2* | 8/2020 | Worones | ............. | H01F 27/2804 |
| 2005/0248430 A1* | 11/2005 | Dupraz | ................ | G01R 15/181 336/200 |
| 2011/0148561 A1* | 6/2011 | Lint | .................... | G01R 19/0092 29/605 |
| 2012/0049839 A1* | 3/2012 | Kiendl | ..................... | H01F 27/36 324/127 |
| 2016/0266171 A1* | 9/2016 | Walsh | ...................... | H01C 1/16 |

FOREIGN PATENT DOCUMENTS

| | | | | |
|---|---|---|---|---|
| EP | 3435097 A1 * | 1/2019 | | |
| FR | 3013500 A1 * | 5/2015 | .......... | G01R 15/181 |
| KR | 101466453 B1 * | 11/2014 | ............... | H01F 5/02 |
| KR | 101707152 B1 * | 2/2017 | .......... | G01R 15/181 |

OTHER PUBLICATIONS

David E. Shepard & Donald W. Yauch, An Overview of Rogowski Coil Current Sensing Technology, available at http://www.dynamp.net/ldadocum.nsf/c2270fbdd892ac3e86256e75000ad88a/e710af6d3e0f6255862565d7004b19db/$FILE/Report.pdf, last accessed Sep. 17, 2021, Mar. 30, 1998, 12 pages, LEM DynAmp Inc., Grove City, Ohio, US.

* cited by examiner

*Primary Examiner* — Tung X Nguyen
*Assistant Examiner* — Robert P Alejnikov, Jr.
(74) *Attorney, Agent, or Firm* — Miller Nash; Andrew J. Harrington

(57) ABSTRACT

A current sensor configured to measure current in a current-carrying conductor. The current sensor includes a Rogowski coil having plurality of conductor segments. The plurality of conductor segments are positionable to form a substantially complete loop. A first conductor segment of the plurality of conductor segments is electrically isolated from a second conductor segment of the plurality of conductor segments.

26 Claims, 8 Drawing Sheets

MULTI-SEGMENTED ROGOWSKI-COIL CURRENT SENSOR

CROSS-REFERENCES TO RELATED APPLICATIONS

This patent application claims the benefit of U.S. Provisional Application No. 63/083,526, filed Sep. 25, 2020. That application is incorporated into the present disclosure by this reference.

TECHNICAL FIELD

The subject matter is related to test and measurement systems, and more particularly to devices and methods for measuring electrical current in a device under test.

BACKGROUND

To measure a current flowing in a device-under-test (DUT), an oscilloscope is often used together with a current probe. The current probe functions as a current sensor, having an input that interfaces or couples with the DUT and an output connected to an input channel of the oscilloscope, and is specifically designed, both physically and electrically, for measuring current.

High-bandwidth current measurements may be difficult to make when such a probe contains a flux concentrator, as this increases self-inductance at the expense of slew rate and loading. A Rogowski coil is a known type of current sensor that offers one solution to this problem.

A conventional Rogowski coil consists of a flexible or rigid conductor in a loop, with a spiral coiled around itself on a closed return path in such a way as to output a voltage that is the derivative of the current passed through the center. The output of the coil is connected to an integrator circuit, which converts the signal to a direct representation of the current.

Conventional Rogowski coils, however, are limited in both sensitivity and bandwidth. The challenge in increasing either sensitivity or bandwidth of a conventional Rogowski coil comes from either overloading the coil insulation due to too much developed voltage, or poor response due to high self-inductance.

Configurations of the disclosed technology address shortcomings in the prior art.

DETAILED DESCRIPTION

As described herein, configurations of the disclosed technology include a Rogowski coil that is in multiple segments. Forming the coil from multiple segments allows for better optimization. Due to linearity and superposition, a Rogowski coil may be made up of several segments. Such segments, as long as collectively they substantially surround the current carrying conductor, will, when summed, produce the equivalent external field rejection of a single-segment Rogowski coil. Furthermore, since the self-resonance of each coil segment will be smaller than a single coil of equivalent dimension, the maximum bandwidth of the current measurement can be higher. The output of each segment is passed into a separate integrator. Since differentiation and integration are both linear operations, the output of each integrator may be summed to produce the equivalent signal of a single coil-integrator combo.

Figure 1:
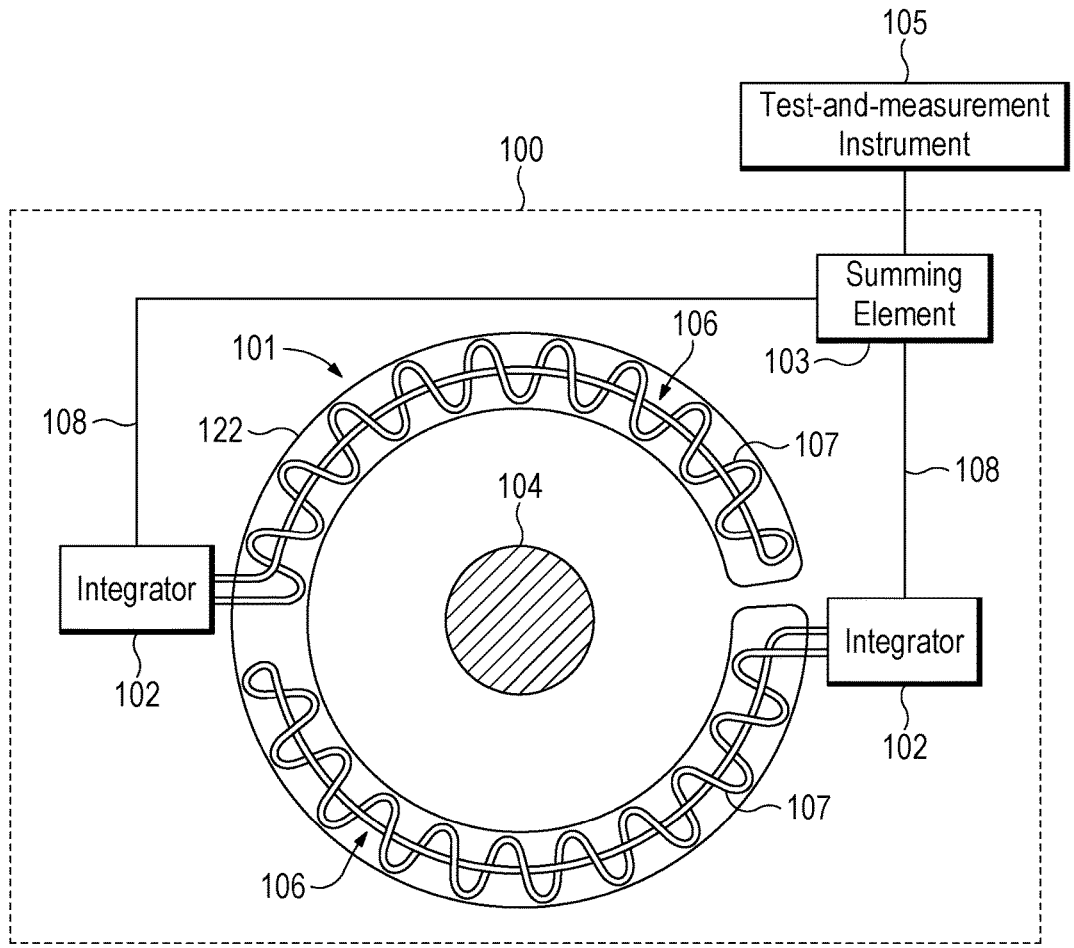
FIG. 1 is a graphical representation of a multi-segment Rogowski-coil current sensor substantially surrounding a current-carrying conductor, according to an example configuration.

FIG. 1 is a graphical representation of a system that includes a multi-segment Rogowski-coil current sensor 100 (also referred to as current sensor 100 in this disclosure) according to an example configuration. As illustrated in FIG. 1, the current sensor 100 may include a Rogowski coil 101, an integrator element 102, and a summing element 103. The current sensor 100 is configured to measure current in a current-carrying conductor 104, such as a wire or a trace in a printed circuit board, a cross-section of which is shown in FIG. 1. The current sensor 100 may be coupled to a test-and-measurement instrument 105. The test-and-measurement instrument 105 may be, for example, an oscilloscope.

The Rogowski coil 101 includes more than one conductor segment 106, where each segment includes a helically wound wire 107. All examples in this disclosure show each conductor segment including a helically wound wire, but alternative wiring techniques to form a Rogowski coil are also compatible with the disclosed technology. The conductor segments 106 are arranged to form a substantially complete loop, or are positionable to form a substantially complete loop. As used in this disclosure, "substantially complete" means largely or essentially whole, without requiring perfect entireness. For example, in configurations there may be gaps or spaces between adjacent conductor segments 106 as long as, all together, the conductor segments 106 may be positioned to form a loop. Accordingly, the Rogowski coil 101 substantially surrounds the current-carrying conductor 104. As used in this disclosure, "substantially surround" means largely or essentially extending around, without requiring perfect encircling. The conductor segments 106 may all be the same length, or the conductor segments 106 may have different lengths. In configurations, each of the conductor segments 106 that make up the Rogowski coil 101 is in a common housing 122, an example of which is shown in FIG. 1. In configurations, the conductor segments 106 that make up the Rogowski coil 101 may be in separate housings 122, examples of which are shown in FIGS. 8A to 8C and FIG. 10. In configurations, the conductor segments 106 that make up the Rogowski coil 101 are electrically isolated from each other, meaning that the conductor segments 106 are not electrically coupled, other than through an integrator element, a summing element, or a buffer element as described in this disclosure.

Each conductor segment 106 is configured to provide multiple electrical signals, or a continuous electrical signal, over time. The electrical signal, which may be a voltage signal, is related to the amount of current flowing in the current-carrying conductor 104. Each conductor segment 106 that makes up the Rogowski coil 101 need not be physically separated from each other conductor segment 106 of the Rogowski coil 101 since each conductor segment 106, as a natural result of how it operates, develops an independent electrical signal at its output. Hence, as discussed below for FIG. 9, in configurations adjacent conductor segments 106 may be shorted together.

The summing element 103 is configured to produce a sum of outputs of the individual integrator elements 102 (which are discussed in more detail below). In configurations, the summing element 103 may be, for example, a summing amplifier, implemented either as an analog circuit or as a digital equivalent of an analog summing amplifier. While illustrated in FIG. 1 as being functionally separate from the test-and-measurement instrument 105, in configurations the summing element 103 may be within the test-and-measurement instrument 105.

The integrator element 102 is configured to provide an output signal (represented by pathway 108) that is proportional to electrical current in the current-carrying conductor 104. The integrator element 102 may be an analog circuit element, such as described for FIGS. 2-5 below, or the integrator element 102 may be a digital equivalent of the analog circuit elements described in this disclosure. Each integrator element 102 may include an analog-to-digital converter, either at the inputs side of the integrator (for example, for an integrator element that operates digitally) or at the output side of the integrator (for example, for an analog integrator element whose output signal is passed to a digital circuit element). While illustrated in FIG. 1 as being functionally separate from the test-and-measurement instrument 105, in configurations one or more of the integrator elements 102 may be within the test-and-measurement instrument 105. For each of the circuits illustrated in FIGS. 2-5, the impedance load placed across the coil output may be reconfigurable by, for example, changing the value of the resistor across the coil output.

In configurations, the position of a first conductor segment 106 relative to a second conductor segment 106 may be determined by introducing a signal to the first conductor segment 106 and receiving a corresponding signal from the second conductor element.

Figure 2:
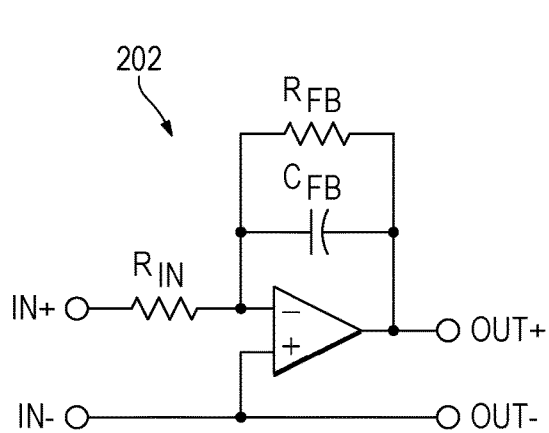
FIG. 2 is a schematic illustrating an integrator element, according to an example configuration.

FIG. 2 is a schematic of an integrator element 202, according to an example configuration. The integrator element 202 of FIG. 2 may be used for the integrator element 102 described above for FIG. 1. As illustrated in FIG. 2, the integrator element 202 is configured to receive, at inputs of the integrator element 202, an electrical signal output from a single conductor segment 106 of the plurality of conductor segments 106 that make up the Rogowski coil 101. In such configurations, there may be an individual integrator element 202 for each of the conductor segments 106 that make up the Rogowski coil 101.

Figure 3:
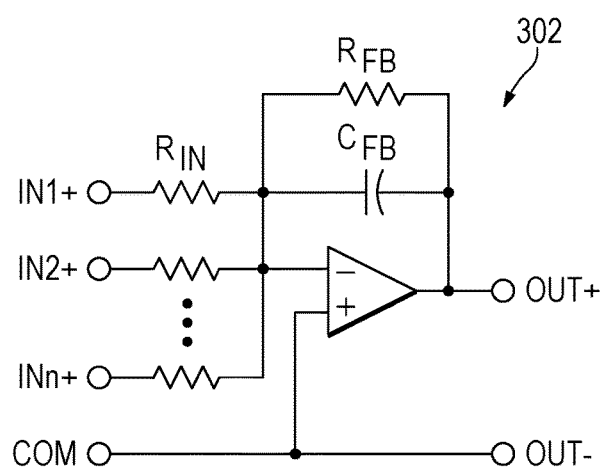
FIG. 3 is a schematic illustrating an integrator element configured to accept multiple inputs, according to an example configuration.

FIG. 3 is a schematic of an integrator element 302, according to an example configuration. The integrator element 302 of FIG. 3 may be used for the integrator element 102 described above for FIG. 1, including as a replacement for both of the integrator elements 102 illustrated in FIG. 1. As illustrated in FIG. 3, the integrator element 302 is configured to receive, at inputs of the integrator element 302, an electrical signal output from more than one conductor segment 106 of the plurality of conductor segments 106 that make up the Rogowski coil 101. FIG. 3 illustrates that there may be any number of inputs (identified as 1 to n) of the integrator element 302, where each input of the integrator element 302 corresponds to one of the n conductor segments 106. As illustrated in FIG. 3, the conductor segments 106 that are the input sources for the integrator element 302 share a common ground.

Figure 4:
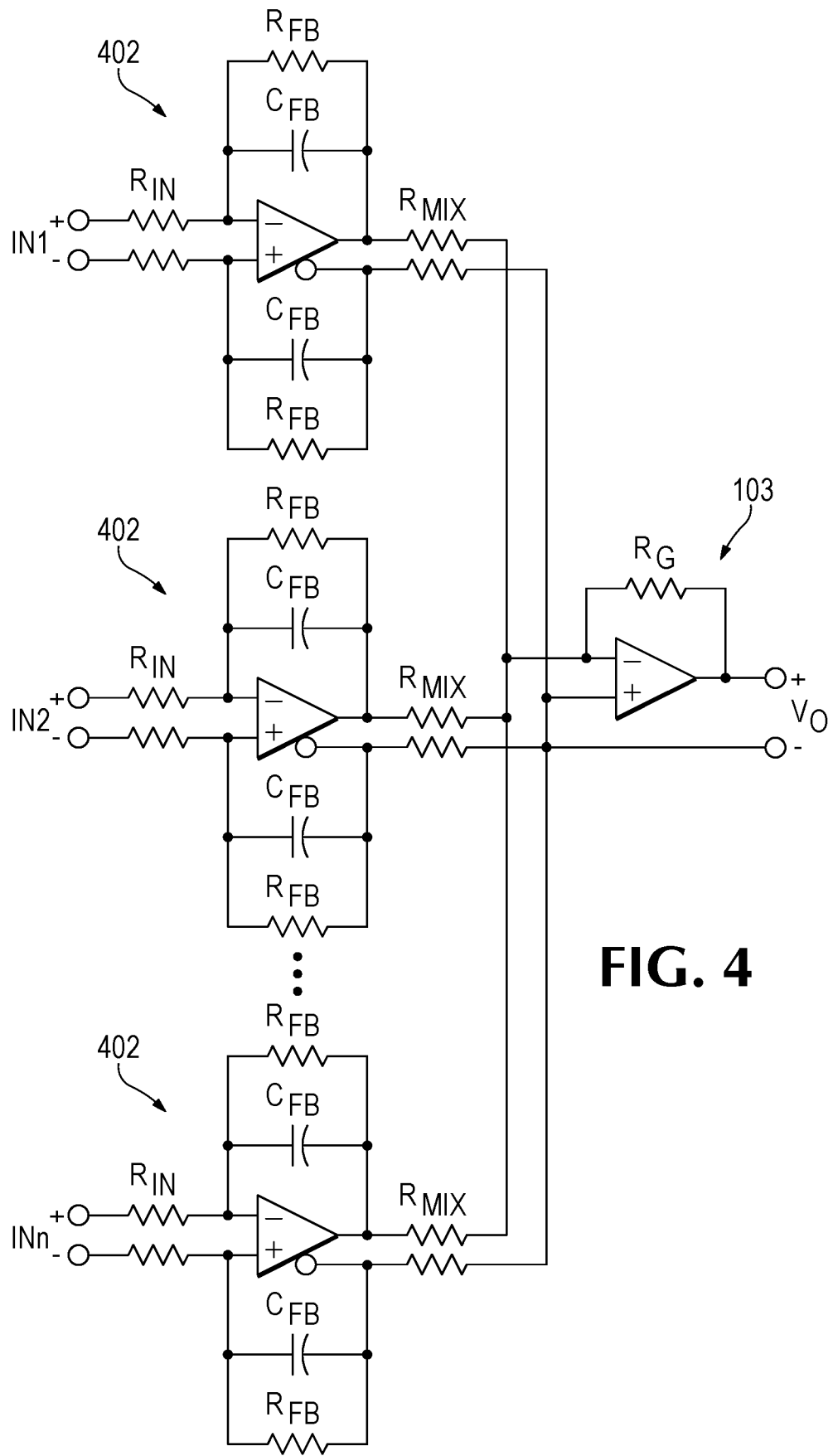
FIG. 4 is a schematic illustrating multiple integrator elements coupled to an example of a summing element, according to an example configuration.

FIG. 4 is a schematic of multiple integrator elements 402 coupled to an example of a summing element 103, according to an example configuration. The integrator elements 402 of FIG. 4 may be used for the integrator elements 102 described above for FIG. 1. As illustrated in FIG. 4, more than one integrator element 402 may be combined with a summing element 103 (which is discussed above for FIG. 1) such that the outputs of the multiple integrator elements 402 are inputs to the summing element 103. The integrator elements 402 illustrated in FIG. 4 may be as described above for the integrator elements 102 of FIG. 1 and the integrator elements 202 of FIG. 2. FIG. 4 illustrates that there may be any number of integrator elements 402 (1 to n), where each integrator element 402 corresponds to one of the n conductor segments 106. In configurations, the inputs to each integrator element 402 are differential, to allow each conductor segment 106 of the Rogowski coil 101 to connect to an individual integrator element 402 without requiring that the conductor segments 106 share a common reference terminal. In configurations where one or more of the conductor segments 106 do share a common terminal, one differential input of each integrator element 402 may be tied to the common reference terminal to reduce wiring complexity.

Figure 5:
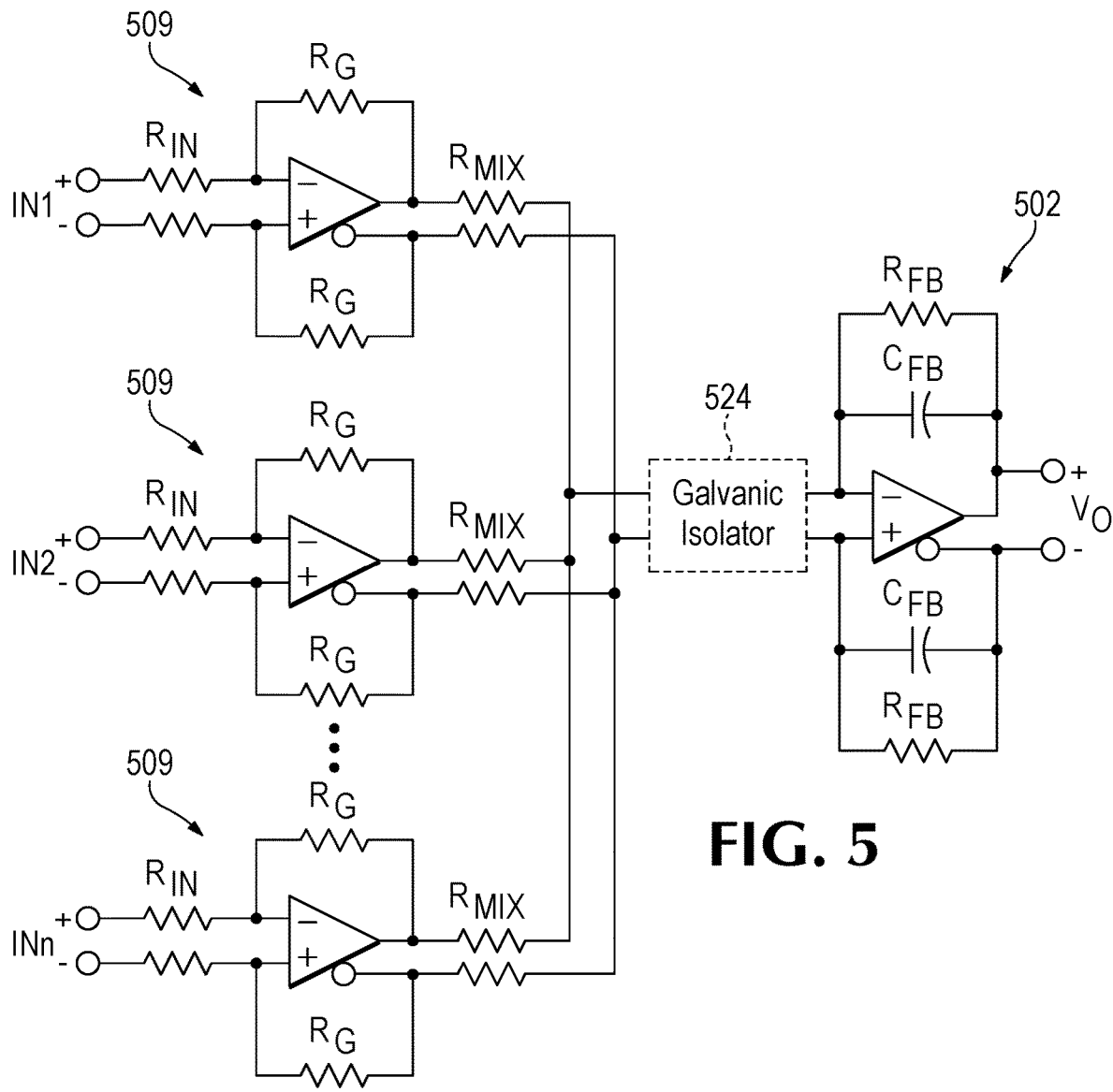
FIG. 5 is a schematic illustrating multiple buffers coupled to an example of an integrator, according to an example configuration.

FIG. 5 is a schematic illustrating multiple buffer elements 509 coupled to an example of an integrator element 502, according to an example configuration. The integrator element 502 of FIG. 5 may be used for the integrator element 102 described above for FIG. 1, including as a replacement for both of the integrator element 102 illustrated in FIG. 1. Hence, for example, each conductor segment 106 of the plurality of conductor segments 106 that make up the Rogowski coil 101 may be coupled to a buffer element 509, such that the electrical signal output of the conductor segment 106 is provided to the respective buffer element 509, and the integrator element 502 is configured to receive an output from more than one (including all) of the individual buffer elements 509. This example configuration is one way to electrically isolate several Rogowski coil 101 conductor segments 106 from each other. Electrical isolation may, for example, allow a higher operating bandwidth than in the absence of electrical isolation. Additionally, this example configuration may help improve sensitivity. In versions, the example configuration illustrated in FIG. 5 may include a galvanic isolator 524 configured to prevent a direct conduction path between buffer elements 509 and the integrator element 502. The galvanic isolator 524 may be or include, for example, a transformer or other circuit elements known to provide galvanic isolation.

Figure 6:
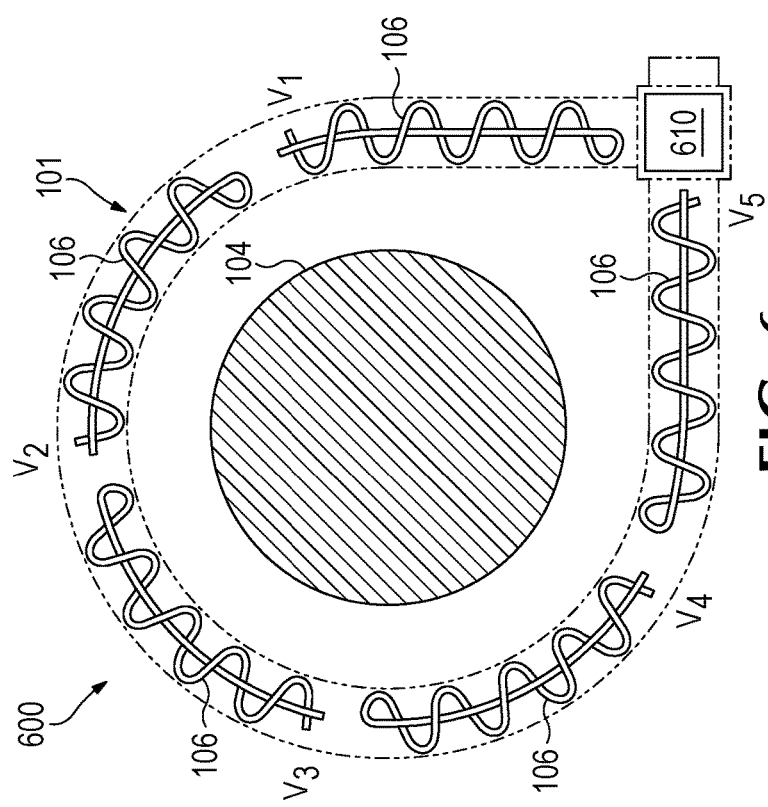
FIG. 6 illustrates an example of an adjustable-length multi-segment Rogowski-coil current sensor, according to an example configuration.
Figure 7:
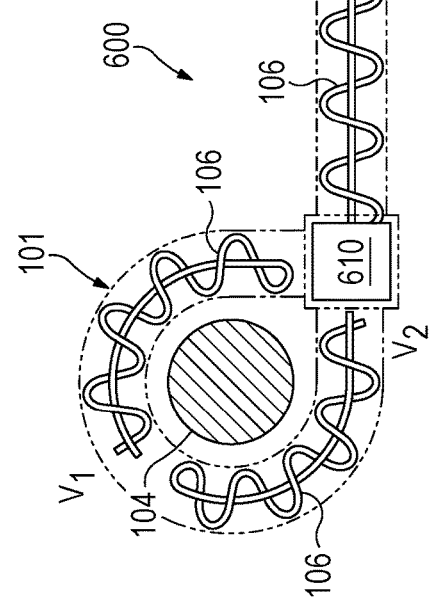
FIG. 7 illustrates the adjustable-length multi-segment Rogowski-coil current sensor of FIG. 6, shown as surrounding a current-carrying conductor that is smaller than the current-carrying conductor shown in FIG. 6, according to an example configuration.

FIG. 6 illustrates an example of an adjustable-length multi-segment Rogowski-coil current sensor 600, according to an example configuration. FIG. 7 illustrates the adjustable-length multi-segment Rogowski-coil current sensor 600 of FIG. 6, shown as surrounding a current-carrying conductor 104 that is smaller than the current-carrying conductor 104 shown in FIG. 6. As illustrated in FIGS. 6-7, the adjustable-length current sensor 600 includes more than one conductor segment 106, each generating a voltage signal. The example voltage signals for the conductor segments 106 are labeled in FIGS. 6-7 as $V_1$ to $V_5$. Some or all of the conductor segments 106 of the adjustable-length current sensor 600 form a Rogowski coil 101.

One end of the chain of conductor segments 106 may be coupled to a cinch mechanism 610 configured to mechanically cinch the conductor segments 106 to utilize a desired number of conductor segments 106 to form the Rogowski coil 101. As illustrated in FIG. 7, the cinch mechanism 610 is configured to divide the portion of the conductor segments 106 that comprise the Rogowski coil 101, or loop, (such as those conductor segments 106 corresponding to voltage signals $V_1$ and $V_2$ in FIG. 7) and the portion of the conductor segments 106 that are outside of the Rogowski coil 101, or loop, (such as those conductor segments 106 corresponding to voltage signals $V_3$, $V_4$, and $V_5$ in FIG. 7).

The adjustable-length current sensor 600 may further include a detector configured to detect how many conductor segments 106 are forming the Rogowski coil 101. The detector may be or include, for example, a mechanical detector or switch or an optical detector or switch. In addition, or instead, the conductor segments 106 may include a physical identifier or an electronic identifier that is sensed by the detector when the conductor segment 106 passes through or past the detector as the adjustable-length multi-segment Rogowski-coil current sensor 600 is cinched around the current-carrying conductor 104. As an example, where the detector includes an optical detector, the optical detector may be triggered by a pattern, such as a dot code or bar code. Examples utilizing a mechanical detector include a set of contacts brushing against a set of conductors that are configured uniquely for each position, a rotary encoder engaged by gear teeth or a friction mechanism. Other examples of a detector may include an RFID (radio-frequency identification) detector, a Hall sensor, or a potentiometer. In configurations, the detector may be part of the cinch mechanism 610.

By way of example, the detector illustrated in FIG. 6 would detect that five conductor segments 106 make up the Rogowski coil 101 of FIG. 6. And the detector illustrated in FIG. 7 would detect that two conductor segments 106 make up the Rogowski coil 101 of FIG. 7, with the remaining three conductor segments 106 being outside of the Rogowski coil 101 of FIG. 7. The conductor segments 106 outside of the Rogowski coil 101 would be "off" in that their voltage outputs would not be included in the determination of the current flowing through the current-carrying conductor 104. The conductor segments 106 may be "off," for example, because the conductor segment 106 is ignored by the test-and-measurement instrument 105 or because the conductor segment 106 is electrically isolated from the test-and-measurement instrument 105. Those conductor segments 106 that make up the Rogowski coil 101 would be "on" in that their voltage outputs would be included in the determination of the current flowing through the current-carrying conductor 104. The detector may be configured to allow the chain of conductor segments 106 to slide through or past the detector. In this way, the size of the Rogowski coil 101 may be adjusted to accommodate a relatively larger current-carrying conductor 104, such as shown in FIG. 6, or to accommodate a relatively smaller current-carrying conductor 104, such as shown in FIG. 7. In the illustrated configuration, the adjustment method is similar to how the diameter of the loop of a cable tie, or zip tie, is increased and decreased.

Figure 8A:
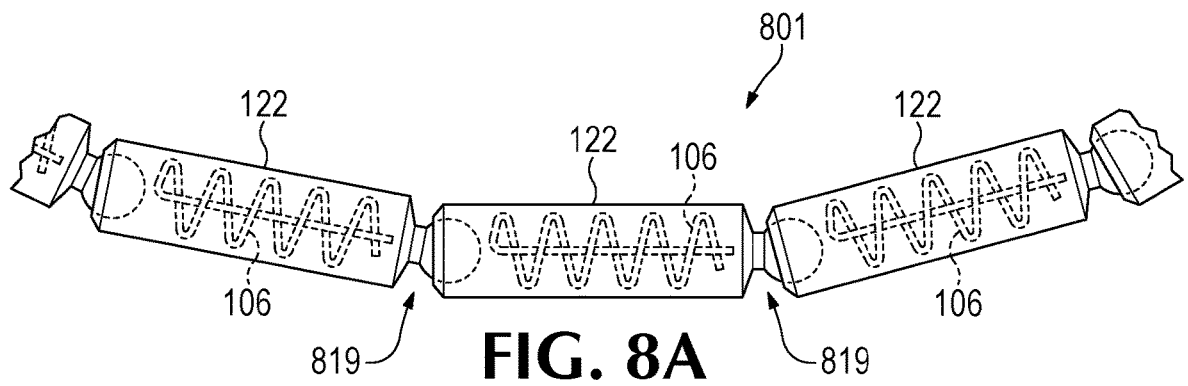
FIGS. 8A to 8C illustrate examples of portions of a multi-segment Rogowski-coil, according to example configurations.
Figure 8B:
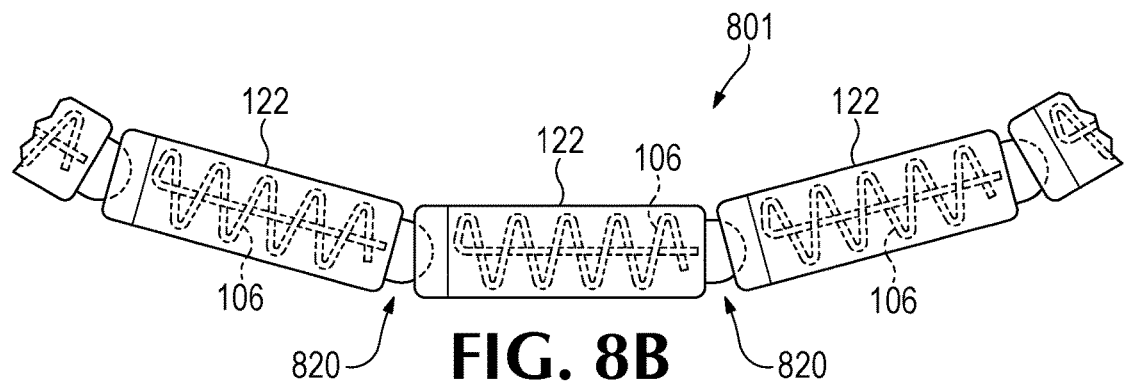
Figure 8C:
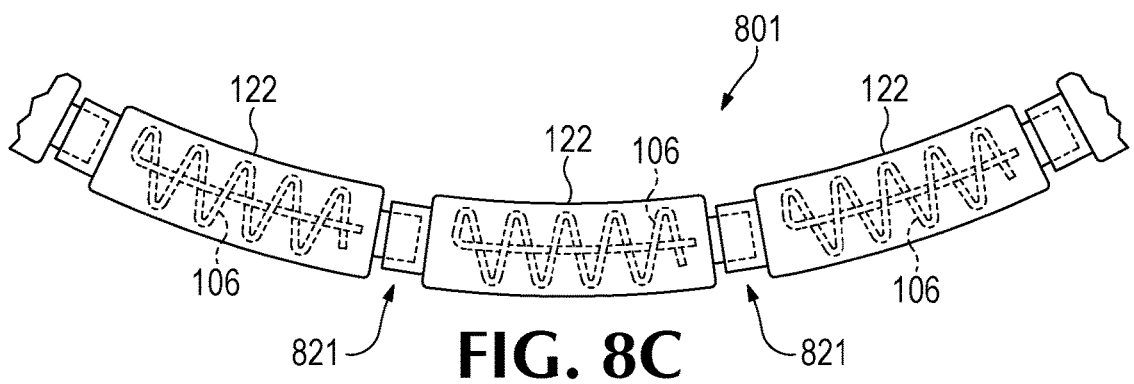

FIGS. 8A to 8C illustrate examples of portions of a multi-segment Rogowski-coil, according to example configurations. More specifically, FIG. 8A to 8C show several conductor segments 106 of the plurality of conductor segments 106 that make up a Rogowski coil 801 of a multi-segment Rogowski-coil current sensor, such as the current sensor 100 discussed above for FIG. 1, the current sensor 600 discussed above for FIG. 6, the current sensor 900 discussed below for FIG. 9, and the current sensor 1000 discussed below for FIG. 10.

As illustrated in FIGS. 8A and 8B, each conductor segment 106 of the plurality of conductor segments 106 may be flexibly joined to an adjacent conductor segment 106. In this context, "flexibly joined" means that the conductor segment 106 can be pivoted or repositioned relative to the adjacent conductor segment 106 while the conductor segment 106 is physically joined to the adjacent conductor segment 106. As examples, the flexible joint could be or include a mechanical snap mechanism 819, such as what is illustrated in FIG. 8A, or a magnetic mechanism 820, such as what is illustrated in FIG. 8B.

In configurations, a conductor segment 106 of the plurality of conductor segments 106 is mechanically separable from the adjacent conductor segment 106 of the plurality of conductor segments 106. In this context, "mechanically separable" means that the conductor segment 106 and the adjacent conductor segment 106 can be separated and moved away from each other without causing permanent damage to either component. As examples, the mechanically separable joint could be or include a mechanical snap mechanism 819 (such as what is illustrated in FIG. 8A), a magnetic mechanism 820 (such as what is illustrated in FIG. 8B), or a plug-and-socket mechanism 821 (such as what is illustrated in FIG. 8C).

Accordingly, a Rogowski coil 801 of any length could be formed by adding or removing conductor segments 106 as needed. Also, the conductor segments 106 may be added in any sequence to form the Rogowski coil 801. The joint configurations illustrated in FIGS. 8A to 8C and discussed here could be used with any of the other configurations described, illustrated, or contemplated by this disclosure.

Figure 9:
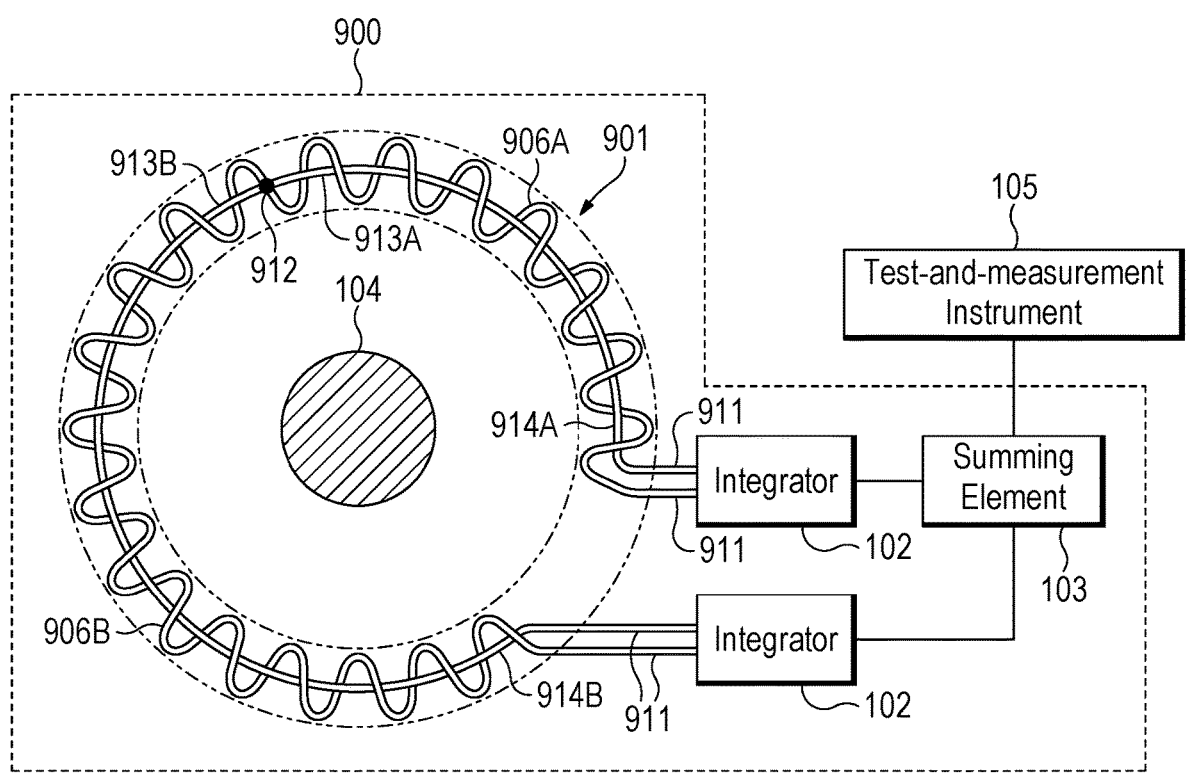
FIG. 9 illustrates an example of a multi-segment Rogowski-coil current sensor that is similar to the multi-segment Rogowski-coil current sensor shown in FIG. 1, except that the output leads of the segments are on the same side of the Rogowski coil, according to an example configuration.

FIG. 9 illustrates an example of a multi-segment Rogowski-coil current sensor 900 that is similar to the multi-segment Rogowski-coil current sensor 100 of FIG. 1, except that the output leads 911 of each of the conductor segments are on the same side of a Rogowski coil 901 of the multi-segment Rogowski-coil current sensor 900 of FIG. 9. Hence, for example, the Rogowski coil 901 may include a first conductor segment 906A and a second conductor segment 906B. The first conductor segment 906A and the second conductor segment 906B may be joined at a tie point 912 on a first end 913A, 913B of each of the first conductor segment 906A and the second conductor segment 906B. Even though the first conductor segment 906A and the second conductor segment 906B are joined electrically at the tie point 912, the first conductor segment 906A and the second conductor segment 906B still develop independent differential voltages at their respective outputs leads 911. Shorting the first conductor segment 906A and the second conductor segment 906B at the tie point 912, however, allows common mode connection between the integrator elements 102. As long as the integrator elements 102 reject any common mode voltages shared by the first conductor segment 906A and the second conductor segment 906B, whether the tie point 912 is shorted together or open does not alter the output of the first conductor segment 906A and the second conductor segment 906B as measured at the outputs leads 911.

A second end 914A, 9148 of each of the first conductor segment 906A and the second conductor segment 906B may include the output leads 911. As illustrated in FIG. 9, the output leads 911 may be coupled to an integrator element 102 for each of the first conductor segment 906 and the second conductor segment 906B. Alternatively, any of the integrator configurations discussed above for FIGS. 2-5 may be utilized in place of the integrator elements 102 illustrated in FIG. 9. Configurations where the output leads 911 are on the same side of the Rogowski coil 901 may have the advantage of providing better access to the output leads 911 for connecting the output leads 911 to other devices or circuit elements.

Figure 10:
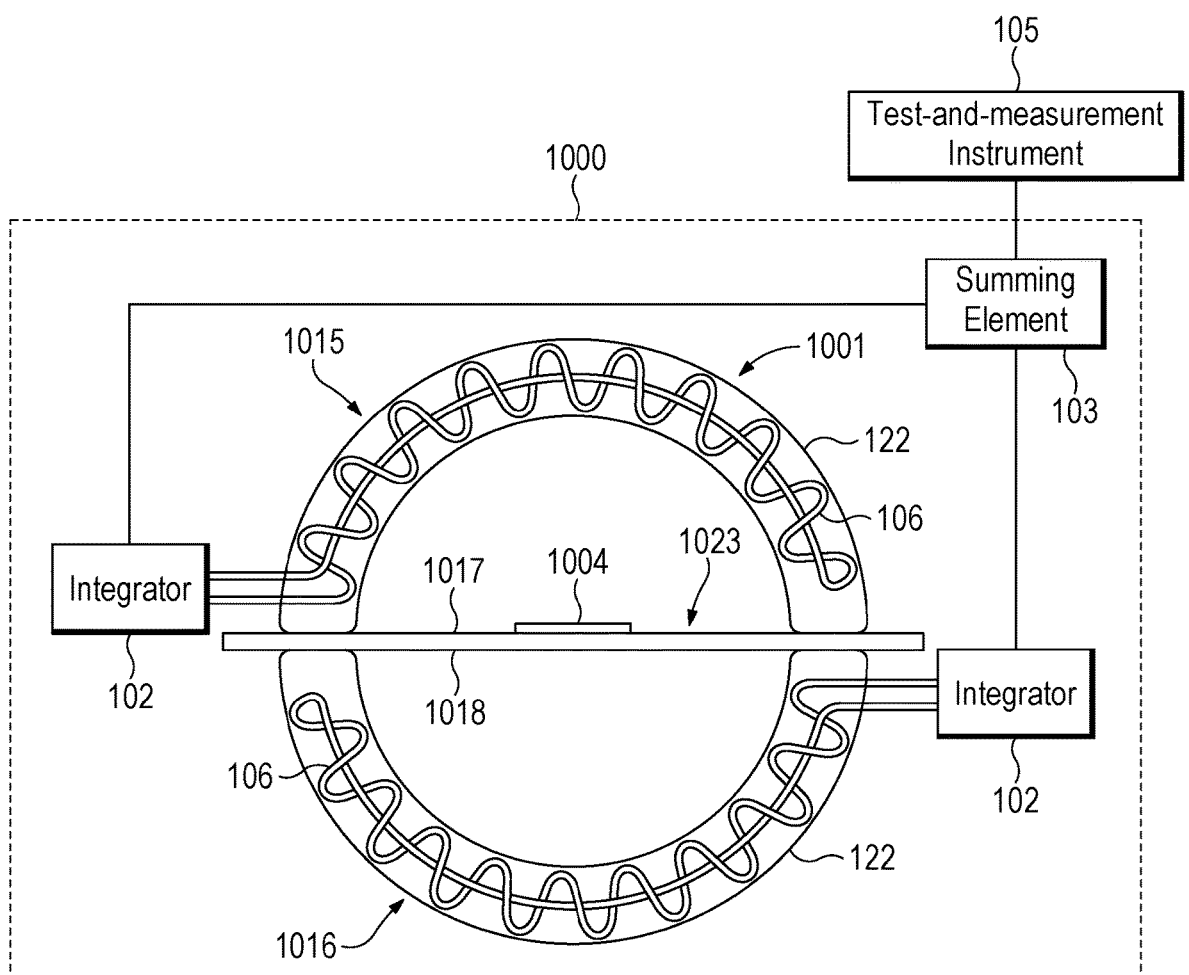
FIG. 10 illustrates an example of a multi-segment Rogowski-coil current sensor in which a first portion is on one side of a printed circuit board and a second portion is on an opposite side of the printed circuit board, according to an example configuration.

FIG. 10 illustrates an example of a multi-segment Rogowski-coil current sensor 1000 in which a first portion 1015 of a Rogowski coil 1001 of the multi-segment Rogowski-coil current sensor 1000 of FIG. 10 is on a first side 1017 of a printed circuit board 1023 and a second portion 1016 of the Rogowski coil 1001 is on a second, opposite side 1018 of the printed circuit board 1023. In other words, the printed circuit board 1023 is between the first portion 1015 of the Rogowski coil 1001 and the second portion 1016 of the Rogowski coil 1001. Each of the first portion 1015 and the second portion 1016 includes one or more conductor segments 106. As illustrated in FIG. 10, each conductor segment 106 may be coupled to an integrator element 102, which, in turn, are connected to a summing element 103. Alternatively, any of the integrator configurations discussed above for FIGS. 2-5 may be utilized in place of the integrator elements 102 illustrated in FIG. 10.

As illustrated in FIG. 10, configurations of the current sensor 1000 may be used to measure current in a trace 1004 on the printed circuit board 1023. In versions of such configurations, the second portion 1016 of the Rogowski coil 1001 may be permanently built into the printed circuit board 1023. In this context, "permanently" means that the second portion 1016 of the Rogowski coil 1001 is not intended to be removed from the Rogowski coil 1001 during normal operation of the multi-segment Rogowski-coil current sensor 1000 of FIG. 10.

In configurations, one or both of the first portion 1015 and the second portion 1016 of the Rogowski coil 1001 may be clamped around the trace to be measured, may be attached to each other, or may be attached to the printed circuit board 1023, as examples. The attachment may be by, for example, magnets or other connection mechanisms.

Figure 11:
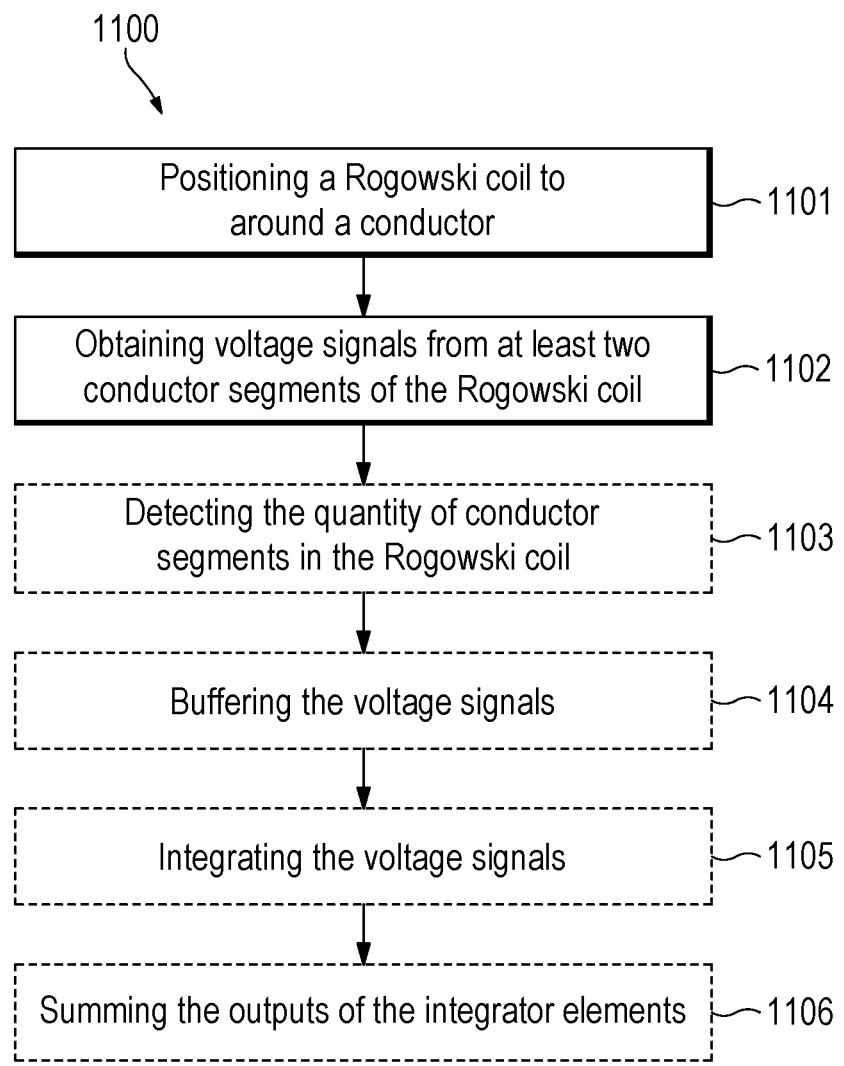
FIG. 11 is a flow chart of an example method of using a multi-segment Rogowski-coil current sensor to measure current in a current-carrying conductor, according to example implementations.

FIG. 11 illustrates an example method of using a current sensor 100 to measure current in a current-carrying conductor 104. As illustrated in FIG. 11, the method 1100 may include positioning 1101 a Rogowski coil 101 to substantially surround a current-carrying conductor 104. The Rogowski coil 101 has plurality of conductor segments 106, and each conductor segment 106 of the plurality of conductor segments 106 includes a helically wound wire 107. The plurality of conductor segments 106 are arranged to form a substantially complete loop.

The method also includes obtaining 1102 a voltage signal from at least two conductor segments 106 of the plurality of conductor segments 106. In configurations, obtaining 1102 the voltage signal from at least two conductor segments 106 of the plurality of conductor segments 106 includes obtaining multiple voltage signals over time from the at least two conductor segments 106 of the plurality of conductor segments 106. In such configurations, the method may also include integrating 1105, with an integrator element 102, the multiple voltage signals to produce an integrated output signal.

In configurations where multiple voltage signals over time are obtained, the method may also include integrating 1105, with a first integrator element 102, the multiple voltage signals of a first conductor segment 106 of the at least two conductor segments 106 to produce a first integrated output signal; integrating 1105, with a second integrator element 102, the multiple voltage signals of a second conductor segment 106 of the at least two conductor segments 106 to produce a second integrated output signal; and summing 1106, with a summing element 103, the first integrated output signal and the second integrated output signal.

In configurations where multiple voltage signals over time are obtained, the method may also include buffering 1104, with a first buffer element 509, the multiple voltage signals of a first conductor segment 106 of the at least two conductor segments 106 to produce a first buffered signal; buffering 1104, with a second buffer element 509, the multiple voltage signals of a second conductor segment 106 of the at least two conductor segments 106 to produce a second buffered signal; and integrating 1105, with an integrator element 102, the first buffered signal and the second buffered signal.

In configurations, positioning 1101 the Rogowski coil 101 to substantially surround the current-carrying conductor 104 may include positioning a first portion 1015 of the Rogowski coil 101 on a first side 1017 of a printed circuit board 1023; and positioning a second portion 1016 of the Rogowski coil 101 on a second side of the printed circuit board 1023, the printed circuit board 1023 being between the first portion 1015 of the Rogowski coil 101 and the second portion 1016 of the Rogowski coil 101, each of the first portion 1015 and the second portion 1016 including one or more conductor segments 106 of the plurality of conductor segments 106.

In configurations, positioning 1101 the Rogowski coil 101 to substantially surround the current-carrying conductor 104 may include cinching the plurality of conductor segments 106 such that a first portion 1015 of the plurality of conductor segments 106 forms the Rogowski coil 101 and a second portion 1016 of the plurality of conductor segments 106 is outside of the Rogowski coil 101. In such configurations, the method may further include detecting 1103, with a detector, a quantity of conductor segments 106 in the first portion 1015 of the plurality of conductor segments 106.

EXAMPLES

Illustrative examples of the disclosed technologies are provided below. A particular configuration of the technologies may include one or more, and any combination of, the examples described below.

Example 1 includes a current sensor configured to measure current in a current-carrying conductor, the current sensor comprising a Rogowski coil having plurality of conductor segments, the plurality of conductor segments positionable to form a substantially complete loop, in which a first conductor segment of the plurality of conductor segments is electrically isolated from a second conductor segment of the plurality of conductor segments.

Example 2 includes the current sensor of Example 1, further comprising an integrator element configured to receive an output from the first conductor segment of the plurality of conductor segments.

Example 3 includes the current sensor of any of Examples 1-2, further comprising an individual integrator element for each conductor segment of the plurality of conductor segments.

Example 4 includes the current sensor of Example 3, further comprising a summing element configured to produce a sum of outputs of the individual integrator elements.

Example 5 includes the current sensor of Example 4, in which the summing element is a summing amplifier.

Example 6 includes the current sensor of any of Examples 1-5, further comprising an integrator element configured to receive an output from more than one conductor segment of the plurality of conductor segments.

Example 7 includes the current sensor of any of Examples 1-6, in which an output lead of the first conductor segment is on a same side of the Rogowski coil as an output lead of the second conductor segment.

Example 8 includes the current sensor of any of Examples 1-7, in which the first conductor segment of the plurality of conductor segments is flexibly joined to an adjacent conductor segment of the plurality of conductor segments.

Example 9 includes the current sensor of any of Examples 1-7, in which the first conductor segment of the plurality of conductor segments is mechanically separable from an adjacent conductor segment of the plurality of conductor segments.

Example 10 includes the current sensor of any of Examples 1-9, in which the first conductor segment of the plurality of conductor segments is galvanically isolated from another conductor segment of the plurality of conductor segments.

Example 11 includes the current sensor of any of Examples 1-10, further comprising an individual buffer element for each conductor segment of the plurality of conductor segments.

Example 12 includes the current sensor of Example 11, further comprising an integrator element configured to receive an output from more than one of the individual buffer elements.

Example 13 includes the current sensor of any of Examples 1-12, in which a quantity of conductor segments comprising the Rogowski coil is adjustable.

Example 14 includes the current sensor of Example 13, further comprising a cinch mechanism to separate a first portion of conductor segments comprising the Rogowski coil and a second portion of conductor segments outside of the Rogowski coil, the first portion of conductor segments and the second portion of conductor being coupled together.

Example 15 includes the current sensor of Example 14, further comprising a detector configured to detect the quantity of conductor segments that are forming the Rogowski coil.

Example 16 includes the current sensor of Example 15, in which the detector comprises at least one of a mechanical switch or an optical switch to detect the quantity of conductor segments that are forming the Rogowski coil.

Example 17 includes the current sensor of any of Examples 1-16, in which each conductor segment of the plurality of conductor segments is in a common housing.

Example 18 includes the current sensor of any of Examples 1-16, in which the first conductor segment of the plurality of conductor segments is in a first housing and the second conductor segment of the plurality of conductor segments is in a second housing that is separate from the first housing.

Example 19 includes a method of using a current sensor to measure current in a current-carrying conductor, the method comprising: positioning a Rogowski coil to substantially surround a current-carrying conductor, the Rogowski coil having plurality of conductor segments, the plurality of conductor segments being arranged to form a substantially complete loop; and obtaining a voltage signal from at least two conductor segments of the plurality of conductor segments.

Example 20 includes the method of Example 19, in which obtaining the voltage signal from at least two conductor segments of the plurality of conductor segments includes obtaining multiple voltage signals over time from the at least two conductor segments of the plurality of conductor segments.

Example 21 includes the method of Example 20, further comprising integrating, with an integrator element, the multiple voltage signals to produce an integrated output signal.

Example 22 includes the method of Example 21, further comprising buffering, with a buffer element, the multiple voltage signals prior to integrating the multiple voltage signals.

Example 23 includes the method of any of Examples 20-22, further comprising: integrating, with a first integrator element, the multiple voltage signals of a first conductor segment of the at least two conductor segments to produce a first integrated output signal; integrating, with a second integrator element, the multiple voltage signals of a second conductor segment of the at least two conductor segments to produce a second integrated output signal; and summing, with a summing element, the first integrated output signal and the second integrated output signal.

Example 24 includes the method of any of Examples 19-23, in which positioning the Rogowski coil to substantially surround the current-carrying conductor comprises: positioning a first portion of the Rogowski coil on a first side of a printed circuit board; and positioning a second portion of the Rogowski coil on a second side of the printed circuit board, the printed circuit board being between the first portion of the Rogowski coil and the second portion of the Rogowski coil, each of the first portion and the second portion including one or more conductor segments of the plurality of conductor segments.

Example 25 includes the method of any of Examples 19-23, in which positioning the Rogowski coil to substantially surround the current-carrying conductor comprises cinching the plurality of conductor segments such that a first portion of the plurality of conductor segments forms the Rogowski coil and a second portion of the plurality of conductor segments is outside of the Rogowski coil.

Example 26 includes the method of Example 25, further comprising detecting, with a detector, a quantity of conductor segments in the first portion of the plurality of conductor segments.

Aspects may operate on a particularly created hardware, on firmware, digital signal processors, or on a specially programmed general purpose computer including a processor operating according to programmed instructions. The terms "controller" or "processor" as used herein are intended to include microprocessors, microcomputers, ASICs, and dedicated hardware controllers. One or more aspects may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various configurations. In addition, the functionality may be embodied in whole or in part in firmware or hardware equivalents such as integrated circuits, field programmable gate arrays (FPGA), and the like. Particular data structures may be used to more effectively implement one or more aspects of the disclosed systems and methods, and such data structures are contemplated within the scope of computer executable instructions and computer-usable data described herein.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular example configuration, that feature can also be used, to the extent possible, in the context of other example configurations.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this application to mean that other components, features, steps, processes, operations, etc. are optionally present. For example, an article "comprising" or "which comprises" components A, B, and C can contain only components A, B, and C, or it can contain components A, B, and C along with one or more other components.

Although specific example configurations have been described for purposes of illustration, it will be understood that various modifications may be made without departing from the spirit and scope of the disclosure.

I claim:

1. A current sensor configured to measure current in a current-carrying conductor, the current sensor comprising a Rogowski coil having plurality of conductor segments, the plurality of conductor segments positionable to form a substantially complete loop, in which a first conductor segment of the plurality of conductor segments is electrically isolated from a second conductor segment of the plurality of conductor segments.

2. The current sensor of claim 1, further comprising an integrator element configured to receive an output from the first conductor segment of the plurality of conductor segments.

3. The current sensor of claim 1, further comprising an individual integrator element for each conductor segment of the plurality of conductor segments.

4. The current sensor of claim 3, further comprising a summing element configured to produce a sum of outputs of the individual integrator elements.

5. The current sensor of claim 4, in which the summing element is a summing amplifier.

6. The current sensor of claim 1, further comprising an integrator element configured to receive an output from more than one conductor segment of the plurality of conductor segments.

7. The current sensor of claim 1, in which an output lead of the first conductor segment is on a same side of the Rogowski coil as an output lead of the second conductor segment.

8. The current sensor of claim 1, in which the first conductor segment of the plurality of conductor segments is flexibly joined to an adjacent conductor segment of the plurality of conductor segments.

9. The current sensor of claim 1, in which the first conductor segment of the plurality of conductor segments is mechanically separable from an adjacent conductor segment of the plurality of conductor segments.

10. The current sensor of claim 1, in which the first conductor segment of the plurality of conductor segments is galvanically isolated from another conductor segment of the plurality of conductor segments.

11. The current sensor of claim 1, further comprising an individual buffer element for each conductor segment of the plurality of conductor segments.

12. The current sensor of claim 11, further comprising an integrator element configured to receive an output from more than one of the individual buffer elements.

13. The current sensor of claim 1, in which a quantity of conductor segments comprising the Rogowski coil is adjustable.

14. The current sensor of claim 13, further comprising a cinch mechanism to separate a first portion of conductor segments comprising the Rogowski coil and a second portion of conductor segments outside of the Rogowski coil, the first portion of conductor segments and the second portion of conductor being coupled together.

15. The current sensor of claim 13, further comprising a detector configured to detect the quantity of conductor segments that are forming the Rogowski coil.

16. The current sensor of claim 15, in which the detector comprises at least one of a mechanical switch or an optical switch to detect the quantity of conductor segments that are forming the Rogowski coil.

17. The current sensor of claim 1, in which each conductor segment of the plurality of conductor segments is in a common housing.

18. The current sensor of claim 1, in which the first conductor segment of the plurality of conductor segments is in a first housing and the second conductor segment of the plurality of conductor segments is in a second housing that is separate from the first housing.

19. A method of using a current sensor to measure current in a current-carrying conductor, the method comprising:
positioning a Rogowski coil to substantially surround a current-carrying conductor, the Rogowski coil having plurality of conductor segments, in which a first conductor segment of the plurality of conductor segments is electrically isolated from a second conductor segment of the plurality of conductor segments, the plurality of conductor segments being arranged to form a substantially complete loop; and obtaining a voltage signal from at least two conductor segments of the plurality of conductor segments.

20. The method of claim 19, in which obtaining the voltage signal from at least two conductor segments of the plurality of conductor segments includes obtaining multiple voltage signals over time from the at least two conductor segments of the plurality of conductor segments.

21. The method of claim 20, further comprising integrating, with an integrator element, the multiple voltage signals to produce an integrated output signal.

22. The method of claim 21, further comprising buffering, with a buffer element, the multiple voltage signals prior to integrating the multiple voltage signals.

23. The method of claim 20, further comprising:

integrating, with a first integrator element, the multiple voltage signals of a first conductor segment of the at least two conductor segments to produce a first integrated output signal;

integrating, with a second integrator element, the multiple voltage signals of a second conductor segment of the at least two conductor segments to produce a second integrated output signal; and summing, with a summing element, the first integrated output signal and the second integrated output signal.

24. The method of claim 19, in which positioning the Rogowski coil to substantially surround the current-carrying conductor comprises:

positioning a first portion of the Rogowski coil on a first side of a printed circuit board; and positioning a second portion of the Rogowski coil on a second side of the printed circuit board, the printed circuit board being between the first portion of the Rogowski coil and the second portion of the Rogowski coil, each of the first portion and the second portion including one or more conductor segments of the plurality of conductor segments.

25. The method of claim 19, in which positioning the Rogowski coil to substantially surround the current-carrying conductor comprises cinching the plurality of conductor segments such that a first portion of the plurality of conductor segments forms the Rogowski coil and a second portion of the plurality of conductor segments is outside of the Rogowski coil.

26. The method of claim 25, further comprising detecting, with a detector, a quantity of conductor segments in the first portion of the plurality of conductor segments.

\* \* \* \* \*